(12) United States Patent
Jung

(10) Patent No.: US 10,444,882 B2
(45) Date of Patent: Oct. 15, 2019

(54) TOUCH SENSING CIRCUIT, TOUCH DISPLAY DEVICE, AND TOUCH SENSING METHOD

(71) Applicant: LG DISPLAY CO., LTD., Seoul (KR)

(72) Inventor: Sojung Jung, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/824,095

(22) Filed: Nov. 28, 2017

(65) Prior Publication Data

US 2018/0150168 A1 May 31, 2018

(30) Foreign Application Priority Data

Nov. 30, 2016 (KR) .................. 10-2016-0162361

(51) Int. Cl.
*G06F 3/041* (2006.01)
*H03M 1/12* (2006.01)
*G06F 3/044* (2006.01)

(52) U.S. Cl.
CPC ............ *G06F 3/0412* (2013.01); *G06F 3/044* (2013.01); *G06F 3/0416* (2013.01); *H03M 1/12* (2013.01)

(58) Field of Classification Search
CPC combination set(s) only.
See application file for complete search history.

(56) References Cited

U.S. PATENT DOCUMENTS

2004/0100450 A1* 5/2004 Choi ................... G06F 3/0412
345/173
2013/0076675 A1* 3/2013 Shin ..................... G06F 3/0416
345/173

* cited by examiner

*Primary Examiner* — Van N Chow
(74) *Attorney, Agent, or Firm* — Birch, Stewart, Kolasch & Birch, LLP

(57) ABSTRACT

Embodiments relate to a touch sensing circuit, a touch display device, and a touch sensing method. The touch sensing circuit may comprise a touch sensing process configured to output a touch driving signal during a touch sensing period to at least two touch electrodes, and to convert a touch sensing signal detected through each touch electrode, to which the touch driving signal is applied, during an analog-to-digital conversion period, into a digital sensing value, and a communication processor configured to transmit sensing data including the digital sensing value converted during the analog-to-digital conversion period to a touch controller, wherein the communication processor starts transmission of the sensing data including converted digital sensing values of at least some of touch sensing signals before each of touch sensing signals detected from the at least two touch electrodes are converted into a digital sensing value. The present invention enables quick touch sensing. In addition, noise generated in the touch information detection process can be reduced and the signal-to-noise ratio can be improved so that the touch sensitivity can be improved.

16 Claims, 16 Drawing Sheets

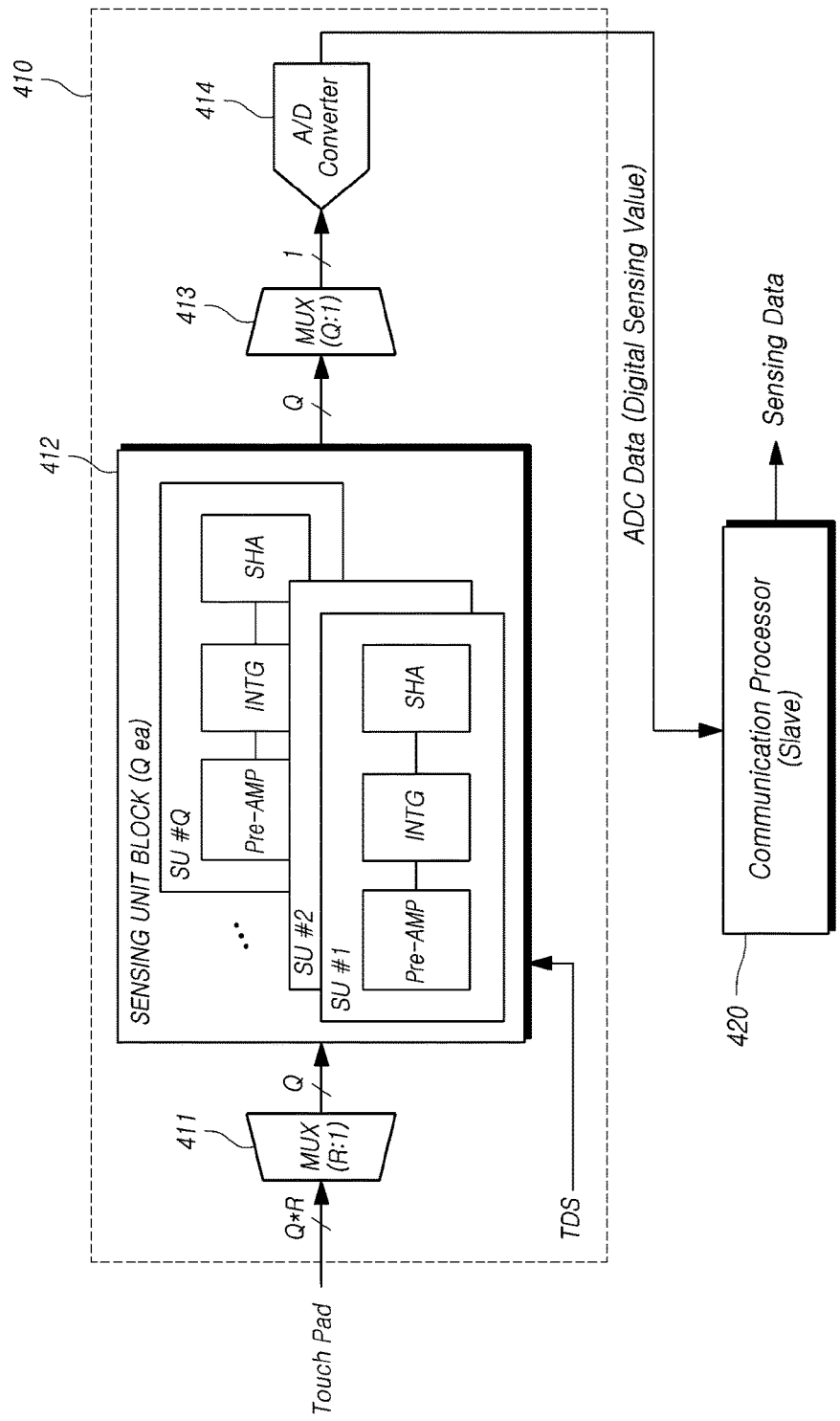

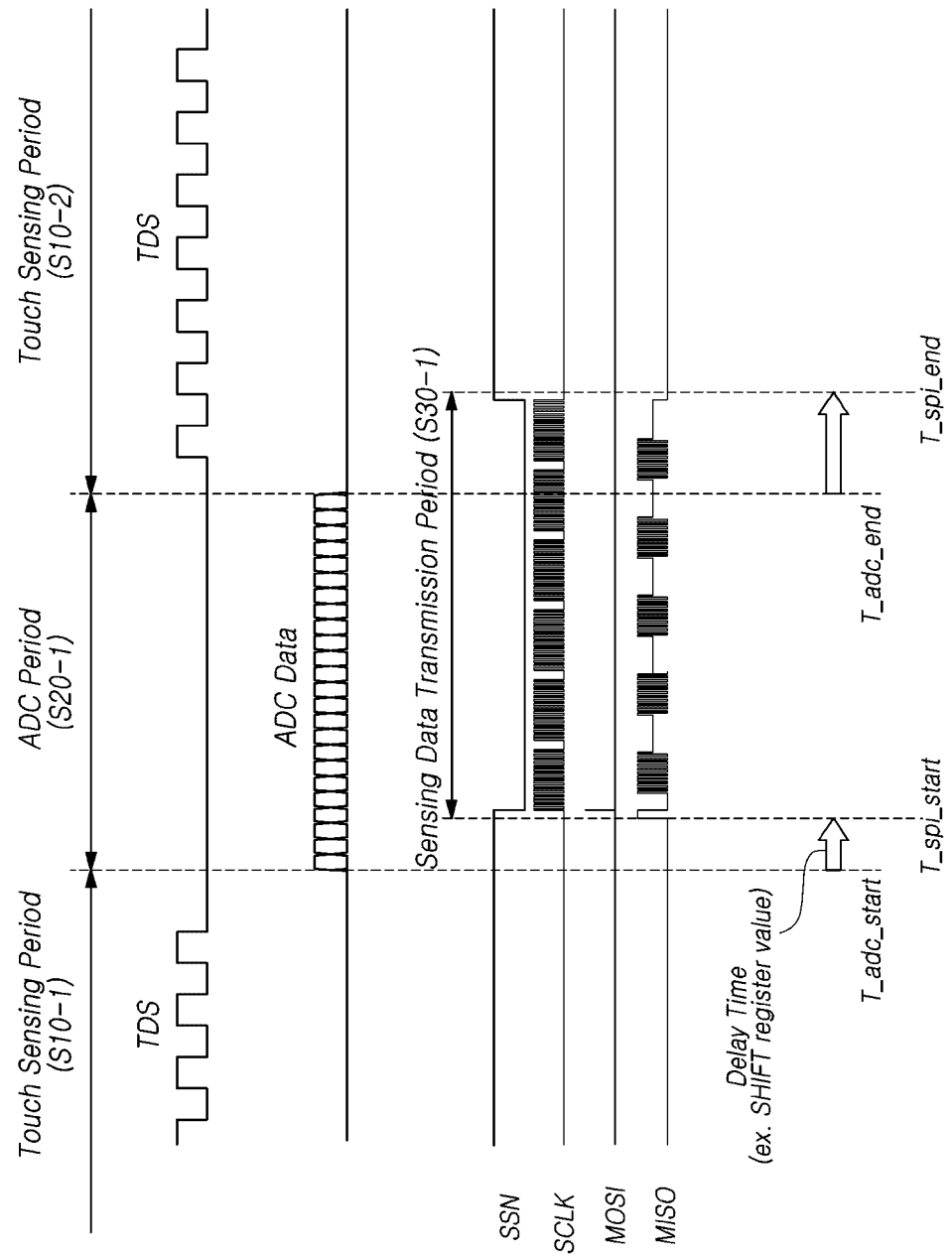

FIG. 13
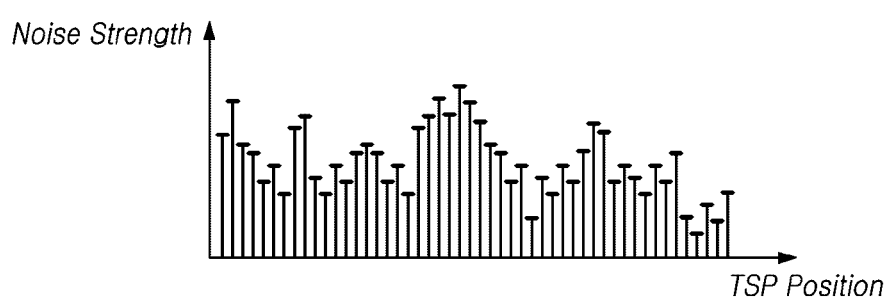
ADC & SPI Communication Serial Process
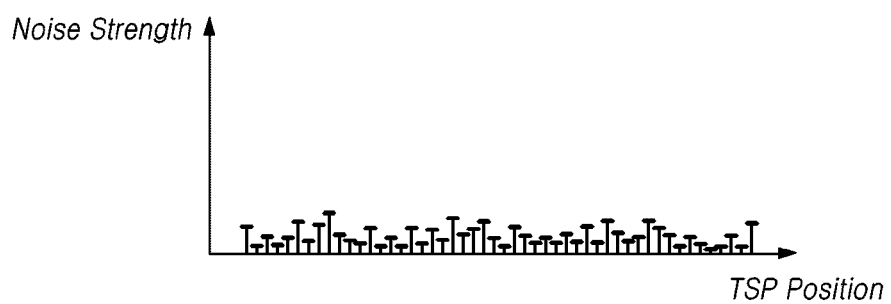
ADC & SPI Communication Parallel Process

TOUCH SENSING CIRCUIT, TOUCH DISPLAY DEVICE, AND TOUCH SENSING METHOD

CROSS REFERENCE TO RELATED APPLICATION

This application claims priority from Korean Patent Application No. 10-2016-0162361, filed on Nov. 30, 2016, which is hereby incorporated by reference for all purposes as if fully set forth herein.

BACKGROUND OF THE INVENTION

1. Field of the Invention

The present disclosure relates to a touch sensing circuit, a touch display device, and a touch sensing method.

2. Description of the Related Art

With the development of information-oriented society, demand for display devices for displaying images in various forms has increased, and various kinds of display devices, such as a Liquid Crystal Display (LCD) device, a Plasma Display Panel (PDP), and an Organic Light Emitting Display (OLED) device, have been utilized.

Among such display devices, there is a touch display device capable of providing a touch-based input system that enables a user to easily input information or a command intuitively and conveniently without using conventional input systems, such as a button, a keyboard, and a mouse.

In order for the touch display device to provide such a touch-based input system, it is necessary to determine the presence or absence of a user's touch, and to correctly detect the touch coordinates (touch position).

The touch display device detects touch sensing signals by driving touch electrodes disposed on a touch screen panel, and detects touch information (presence or absence of a touch, or a touch position) using the touch sensing signals.

In a conventional touch display device, in the process of detecting touch information, there is a problem in that a signal-to-noise ratio is lowered and the touch sensitivity is lowered due to the generation of various kinds of noise.

In addition, since it is necessary for the conventional touch display device to perform touch sensing together with image display within a limited time, there is also a problem in that the touch sensing cannot be performed quickly.

SUMMARY OF THE INVENTION

In view of the foregoing, an object of embodiments disclosed herein is to provide a touch sensing circuit, a touch display device, and a touch sensing method that are capable of improving touch sensitivity by reducing noise generated in the process of detecting touch information and improving the signal-to-noise ratio.

Another object of embodiments disclosed herein is to provide a touch sensing circuit, a touch display device, and a touch sensing method that enable quick touch sensing.

In one aspect, embodiments disclosed herein may provide a touch sensing circuit that may include a touch sensing processor configured to output a touch driving signal to at least two touch electrodes during a touch sensing period, and to convert a touch sensing signal detected through each touch electrode, to which the touch driving signal is applied, during an analog-to-digital conversion period, into a digital sensing value; and a communication processor configured to transmit sensing data including the digital sensing value converted during the analog-to-digital conversion period to a touch controller.

The touch sensing circuit may perform an analog-to-digital conversion process and a communication process with the touch controller (including sensing data transmission process) in parallel.

In another aspect, embodiments disclosed herein may provide a touch sensing circuit that may include a touch sensing processor configured to output a touch driving signal to at least two touch electrodes during a touch sensing period, and to convert a touch sensing signal detected through each touch electrode, to which the touch driving signal is applied, during an analog-to-digital conversion period, into a digital sensing value; and a communication processor configured to transmit sensing data including the digital sensing value converted during the analog-to-digital conversion period to a touch controller. The communication processor of the touch sensing circuit may start transmission of the sensing data including converted digital sensing values of at least some of touch sensing signals before each of touch sensing signals detected from the at least two touch electrodes are converted into a digital sensing value.

In still another aspect, embodiments disclosed herein may provide a touch display device that may include a touch screen panel on which a plurality of touch electrodes are arranged; a touch sensing circuit configured to output a touch driving signal to at least two touch electrodes during a touch sensing period, to convert a touch sensing signal detected through each touch electrode, to which the touch driving signal is applied, during an analog-to-digital conversion period, into a digital sensing value, and to transmit sensing data including a converted digital sensing value; and a touch controller configured to detect touch information by receiving the sensing data. In the touch display device, the touch sensing circuit may start the transmission of the sensing data before the analog-to-digital conversion period is completed.

In still another aspect, embodiments disclosed herein may provide a touch display device that may include a touch sensing circuit that may include: a touch sensing processor configured to output a touch driving signal to at least two touch electrodes during a touch sensing period, and to convert a touch sensing signal detected through each touch electrode, to which the touch driving signal is applied during an analog-to-digital conversion period, into a digital sensing value; and a communication processor configured to transmit the digital sensing value obtained by the analog-to-digital conversion by the touch sensing processor to a touch controller when a predetermined number of digital sensing values are obtained or the digital sensing values are obtained for a predetermined time.

In still another aspect, embodiments disclosed herein may provide a touch sensing method that may include a first step of outputting, by a touch sensing circuit, a touch driving signal to at least two touch electrodes; and a second step of performing an analog-to-digital conversion to convert a touch sensing signal detected by the touch sensing circuit through each touch electrode into a digital sensing value, and transmitting sensing data including a digital sensing value obtained by the analog-to-digital conversion to a touch controller. In the second step, the transmission of the sensing data including the digital sensing value obtained by the analog-to-digital conversion of at least some touch sensing signals may be started before analog-to-digital conversion for touch sensing signals detected through the at least two touch electrodes.

In still another aspect, embodiments disclosed herein may provide a touch sensing circuit which may comprise: a touch sensing processor configured to output a touch driving signal to at least two touch electrodes and to perform analog-to-digital conversion of a touch sensing signal detected through each of the touch electrodes into a digital sensing value; and a communication processor configured to transmit the digital sensing value obtained by the analog-to-digital conversion by the touch sensing processor to a touch controller when a predetermined number of digital sensing values are obtained or the digital sensing values are obtained for a predetermined time.

In still another aspect, embodiments disclosed herein may provide a touch sensing circuit which may comprise: a touch sensing processor configured to output a touch driving signal to at least two touch electrodes and to perform analog-to-digital conversion of a touch sensing signal detected through each of the touch electrodes into a digital sensing value; and a communication processor configured to transmit sensing data including the digital sensing value converted by the analog-to-digital conversion to a touch controller through communication with the touch controller, wherein the analog-to-digital conversion and the communication with the touch controller are performed in parallel.

According to the embodiments described above, it is possible to provide a touch sensing circuit, a touch display device, and a touch sensing method that are capable of improving touch sensitivity by reducing noise generated in the process of detecting touch information and improving the signal-to-noise ratio.

In addition, according to the embodiments disclosed above, it is possible is to provide a touch sensing circuit, a touch display device, and a touch sensing method that enable quick touch sensing.

BRIEF DESCRIPTION OF THE DRAWINGS

The above and other objects, features and advantages of the present invention will be more apparent from the following detailed description taken in conjunction with the accompanying drawings, in which:

FIG. 4A is a diagram illustrating a touch sensing circuit according to the embodiments of the present invention;

FIG. 6 is a timing diagram illustrating parallel process of analog-to-digital conversion and sensing data transmission in a touch sensing system according to the embodiments of the present invention;

FIG. 13 is a diagram illustrating noises depending on presence or absence of a parallel process of analog-to-digital conversion and sensing data transmission in a touch sensing system according to the embodiments of the present invention in comparison.

DETAILED DESCRIPTION OF THE EMBODIMENTS

Figure 1:
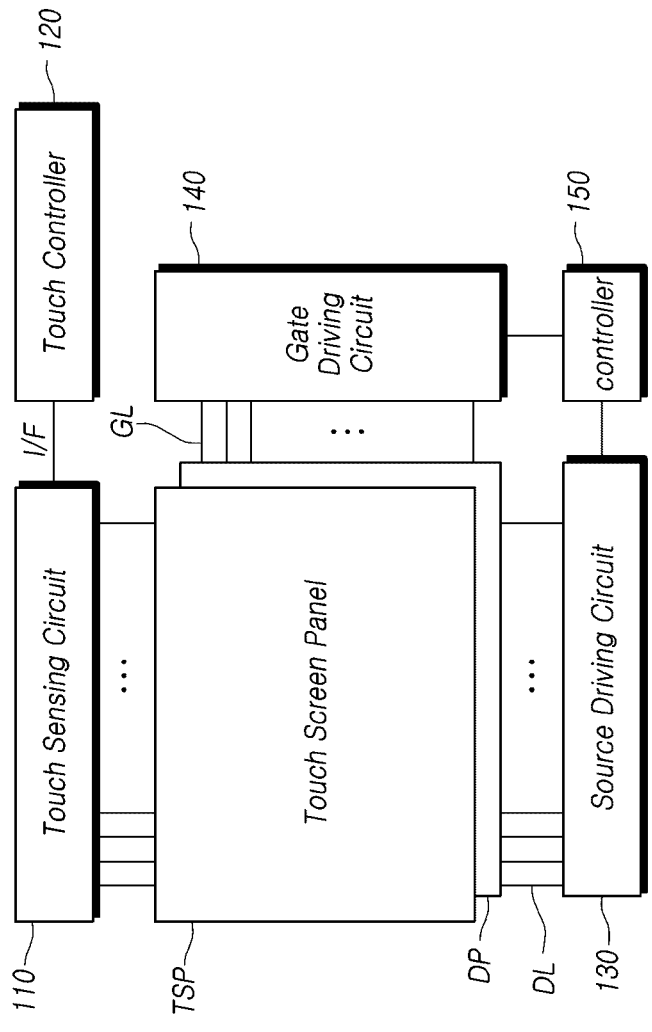
FIG. 1 is a configuration diagram of a touch display device according to the embodiments of the present invention.

Hereinafter, some embodiments of the present invention will be described in detail with reference to the accompanying illustrative drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is bonded to" another structural element, it should be interpreted that another structural element may "be connected to", "be coupled to", or "be bonded to" the structural elements as well as that the certain structural element is directly connected to or is in direct contact with another structural element. Further, the term "may" fully encompasses all the meanings of the term "can".

Figure 2:
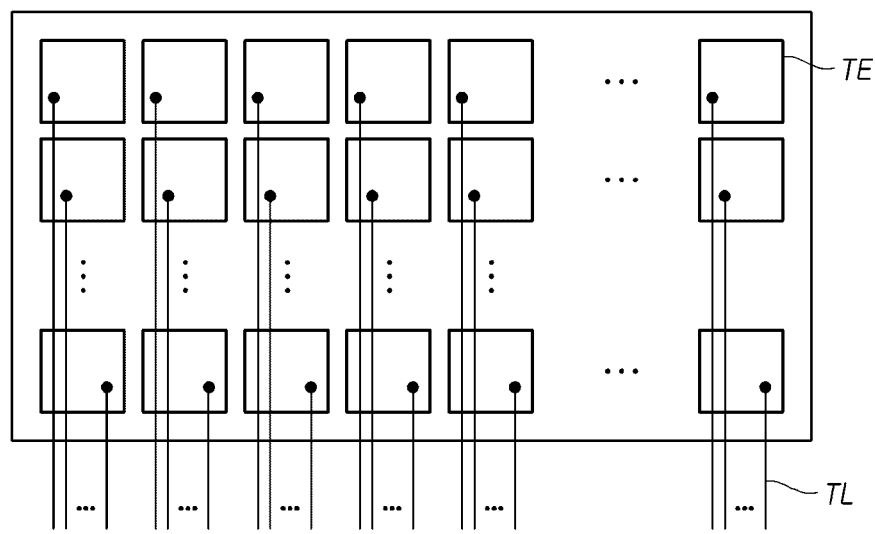
FIG. 2 is an exemplary diagram of a touch screen panel according to the embodiments of the present invention.

FIG. 1 is a configuration diagram of a touch display device 100 according to the embodiments, and FIG. 2 is an exemplary diagram of a Touch Screen Panel (TSP) according to the embodiments. All the components of the touch display device according to all embodiments of the present invention are operatively coupled and configured.

Referring to FIG. 1, the touch display device 100 according to the embodiments may provide an image display function and a touch input function.

The touch display device 100 according to the embodiments may include a display panel DP, a source driving circuit 130, a gate driving circuit 140, a controller 150, and the like in order to provide the image display function.

A plurality of data lines DL and a plurality of gate lines GL are arranged on the display panel DP.

In addition, a plurality of pixels, which are defined by the plurality of data lines DL and the plurality of gate lines GL, are also arranged on the display panel DP.

The source driving circuit 130 is a circuit that drives a plurality of data lines DL for image display, and may output a data voltage corresponding to the image signal through the plurality of data lines DL.

The gate driving circuit 140 sequentially drives the plurality of gate lines GL for image display, and may sequentially output gate signals (scan signals) to the plurality of gate lines GL for image display.

The controller 150 is configured to control the source driving circuit 130 and the gate driving circuit 140 and provides various control signals (e.g., a data driving control signal and a gate driving control signal) to the source driving circuit 130 and the gate driving circuit 140.

The controller 150 starts scanning according to a timing implemented in each frame, converts input image data input from the outside to be suitable for a data signal form used in the source driving circuit 130, thereby outputting converted image data, and controls data driving at a proper time to suit the scanning.

The controller 150 may be a timing controller that is used in a typical display technique, or a control device that additionally perform other control functions, as well as the timing controller function.

In FIG. 1, the source driving circuit 130 is only positioned at one side (e.g., the upper side or the lower side) of the display panel DP, but the source driving circuit 130 may be positioned at the both sides (e.g., the upper side and the lower side) of the display panel DP depending on a driving method, a panel design method, or the like.

The source driving circuit 130 may be implemented by including one or more Source Driver Integrated Circuits (SDICs).

Each SDIC may be connected to a bonding pad of the display panel DP by a Tape Automated Bonding (TAB) method or a Chip-On-Glass (COG) method or may be disposed directly on the display panel DP. In some cases, the SDIC may be integrated in the display panel DP. In addition, each SDIC may be implemented by a Chip-On-Film (COF) method in which the SDIC is mounted on a film connected to the display panel DP.

Each SDIC may include a shift register, a latch circuit, a Digital to Analog Converter (DAC), an output buffer, and the like.

Each SDIC may further include an Analog-to-digital Converter (ADC) in some instances.

In FIG. 1, the gate driving circuit 140 is only positioned at one side (e.g., the left side or the right side) of the display panel DP. However, gate driving circuits may be positioned at the both sides (e.g., the left and right sides) of the display panel DP depending on a driving method, a panel design method, or the like.

The gate driving circuit 140 may be implemented by including one or more Gate Driver Integrated Circuits (GDICs).

Each GDIC may be connected to a bonding pad of the display panel DP by the TAB method or the COG method, or may be disposed directly on the display panel DP by being implemented in a Gate-In-Panel (GIP) type. In some instances, the GDIC may be disposed by being integrated in the display panel DP. In addition, each GDIC may be implemented in the COF method, in which the GDIC is mounted on a film connected to the display panel DP.

Each GDIC may include a shift register, a level shifter, and the like.

Each sub-pixel disposed in the display panel DP may include circuit elements, such as a transistor.

The types and the number of the circuit elements constituting each sub-pixel may be variously determined according to provided functions, a design method, and the like.

The touch display device 100 according to the present embodiment has a function of sensing presence or absence of a user's touch and/or a touch position for touch input.

Here, a touch object, which is a user's touch means, may be, for example, a finger, a pen, or the like.

The touch sensing function may include a finger position sensing function (fingerprint recognition function) for sensing the user's fingerprint as well as a touch position sensing function for sensing the user's touch position.

The touch display device 100 according to the embodiments may include a touch sensing system that includes a Touch Screen Panel (TSP) having a plurality of touch electrodes TE each corresponding to a touch sensor, a touch sensing circuit 110, a touch controller 120, and the like.

The touch screen panel TSP may include a plurality of touch electrodes TE each corresponding to a touch sensor, and may include a plurality of touch lines TL that electrically connect the plurality of touch electrodes TE to the touch sensing circuit 110.

The touch sensing system may determine presence or absence of a touch and/or a touch position based on the capacitance between each touch electrode TE and a touch object, such as a finger.

When a touch sensing method based on self-capacitance is applied, each touch electrode TE functions as either a driving electrode to which a touch driving signal TDS is applied or a sensing electrode (reception electrode) from which a touch sensing voltage is detected.

The touch sensing system may determine presence or absence of a touch and/or a touch position based on the capacitance between touch electrodes TE.

When a touch sensing method based on mutual-capacitance is applied, the plurality of touch electrodes TE are classified into a driving electrode to which a touch driving signal TDS is applied and a sensing electrode (reception electrode) from which a touch sensing voltage is detected.

Hereinafter, for convenience of description, it is assumed that the touch sensing system adopts the touch sensing method based on self-capacitance, and it is also assumed that the touch electrodes TE disposed on the touch screen panel TSP are also touch electrodes for the touch sensing method based on the self-capacitance.

Meanwhile, the touch screen panel TSP may be an external type (or an add-on type) that is provided outside the display panel DP, or a built-in type (e.g., an in-cell type or on-cell type) that is built in the display panel DP.

In this case, the plurality of touch electrodes TE arranged on the touch screen panel TSP operate as touch sensors in, for example, a touch sensing mode period. However, in a display mode period, each touch electrode may be a Common Electrode (CE) to which a common voltage Vcom is applied for image display.

Meanwhile, the touch sensing circuit 110 may be configured separately from the source driving circuit 130, but may be implemented in the form of an integrated driving chip together with the source driving circuit 130.

Meanwhile, the touch display device 100 has two operation modes including a display mode and a touch sensing mode.

The display mode period and the touch sensing mode period may be separated from each other in terms of time.

For example, one display mode period D and one touch sensing mode period T may exist during one image frame period.

Alternatively, two or more display mode periods D1, D2, . . . and two or more touch sensing mode periods T1, T2, . . . may alternately exist during one image frame period.

For example, one image frame period may include a first display mode period D1, a first touch sensing mode period T1, a second display mode period D2, a second touch sensing mode period T2 in time sequence.

Meanwhile, the display mode period and the touch sensing mode period may partially or wholly overlap in terms of time.

Figure 3:
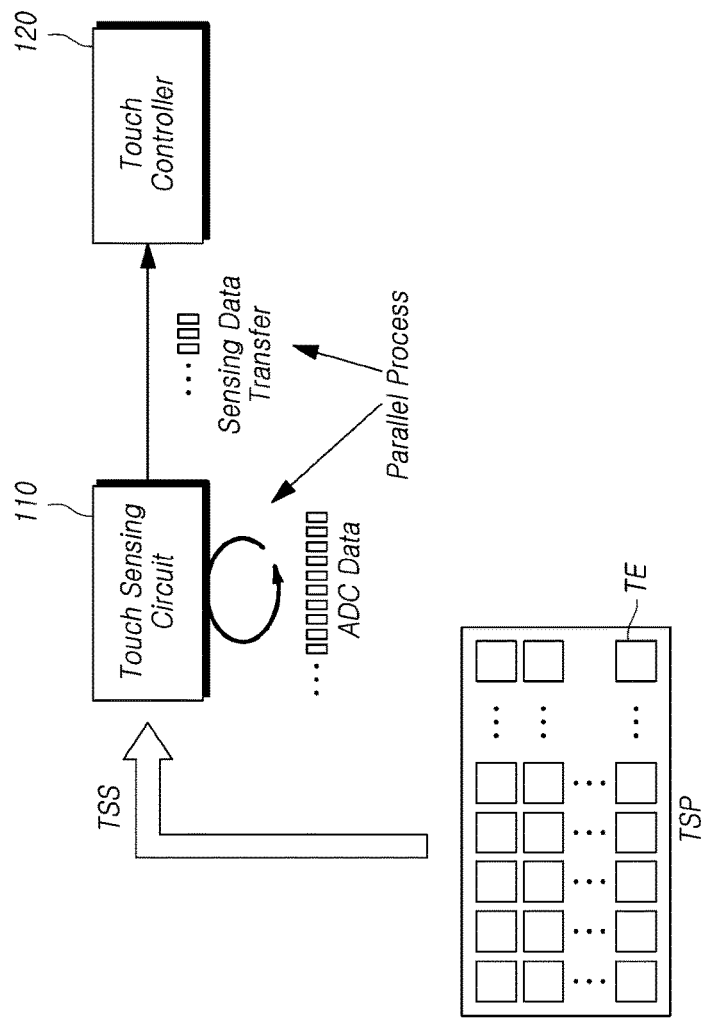
FIG. 3 is a simplified view of a touch sensing system according to the embodiments of the present invention.

FIG. 3 is a simplified view of a touch sensing system according to the embodiments.

Referring to FIG. 3, during the touch sensing mode, the touch sensing system may include a touch sensing circuit 110 configured to detect a touch sensing signal TSS, which varies depending on presence or absence of a touch, by driving the touch screen panel TSP, and a touch controller 120 configured to determine presence or absence of a touch and/or a touch position using the touch sensing result of the touch sensing circuit 110, and the like.

The touch sensing circuit 110 may output a touch driving signal TDS to at least two touch electrodes TE, may convert a touch sensing signal detected through each touch electrode TE, to which the touch driving signal TDS is applied, into a digital sensing value, and may transmit sensing data including the converted digital sensing value to the touch controller 120.

The touch controller 120 may receive the sensing data, and may detect touch information on presence or absence of a touch and/or a touch position based on the sensing data.

The touch sensing circuit 110 may perform a touch driving process for outputting the touch driving signal TDS to at least two touch electrodes TE.

The period in which the touch driving process for driving the touch electrode TE is performed is referred to as a touch sensing period.

The touch sensing circuit 110 may perform Analog-to-digital Conversion (hereinafter, referred to as "ADC") for converting a touch sensing signal detected through each touch electrode TE, to which the touch driving signal TDS is applied, into a digital sensing value.

The period in which the ADC process is performed is referred to as an analog-digital conversion period.

The touch sensing circuit 110 may transmit sensing data including a digital sensing value converted through the ADC.

The period in which the sensing data is transmitted is referred to as the sensing data transmission period.

Referring to FIG. 6, the touch sensing period S10-1, the ADC period S20-1, and the sensing data transmission period S30-1 form one set. In FIG. 6, the touch sensing period S10-2, which is performed after the ADC period S20-1 is completed, becomes another set. The touch sensing mode periods existing between the two display mode periods may include one or more sets.

Figure 4B:
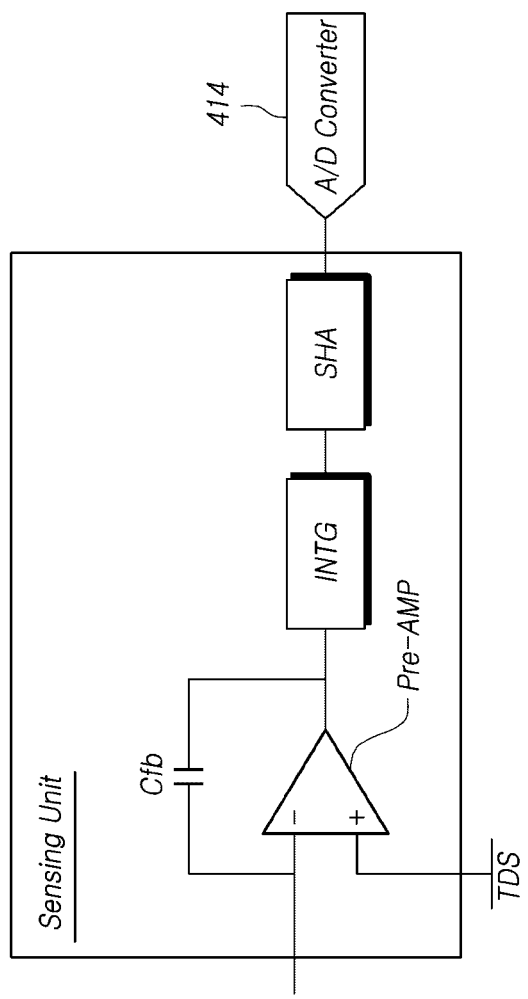
FIG. 4B is a view illustrating a sensing unit in the touch sensing circuit according to the embodiments of the present invention.

FIG. 4A is a diagram illustrating a touch sensing circuit 110 according to the embodiments, and FIG. 4B is a diagram illustrating a sensing unit SU in the touch sensing circuit 110 according to the embodiments.

Referring to FIG. 4A, the touch sensing circuit 110 may include a touch sensing processor 410 for a touch sensing process and an ADC process, a communication processor 420 configured to perform data transmission/reception by communicating with the touch controller 120, and the like.

In this specification, the touch sensing process refers to a sensing process for the touch screen panel TSP, means that the touch sensing circuit 110 receives a touch sensing signal TSS from the touch screen panel TSP by driving the touch screen panel TSP (i.e., by supplying a touch driving signal TDS to the touch electrodes TE disposed in the touch screen panel TSP). Accordingly, the touch sensing process may include a touch driving process, a touch sensing signal receiving process, and the like.

Referring to FIG. 4A, the touch sensing processor 410 may include Q*R touch pads TP, a first multiplexer circuit (MUX) 411, a sensing unit block (Q ea) 412 including Q sensing units SU #1, SU #2, . . . , and SU #Q, a second multiplexer circuit (MUX) 413, an A/D converter 414, and the like.

Referring to FIG. 4B, each touch sensing unit SU may include a preamplifier Pre-AMP, an integrator INTG, a sample and hold circuit SHA, and the like.

The preamplifier Pre-AMP may output an input touch driving signal TDS to the corresponding touch electrode TE of the touch screen panel TSP through the first multiplexer circuit 411.

The first multiplexer circuit 411 is a circuit capable of performing R:1 multiplexing, and may be constituted with at least one multiplexer.

The touch driving signal TDS is output to the touch pad TP corresponding to the touch channel via the first multiplexer circuit 411 and through the preamplifier Pre-AMP.

A capacitor is formed between the touch electrode TE, to which the touch driving signal TDS is applied through the preamplifier Pre-AMP, and a touch object.

The charge charged to such a capacitor may vary depending on presence or absence of a touch.

The charge charged in the capacitor formed between the touch electrode TE and the touch object may be charged in the feedback capacitor Cfb of the preamplifier Pre-AMP.

In this regard, the first multiplexer circuit 411 is a circuit capable of performing R:1 multiplexing, and may be constituted with at least one multiplexer, and may select Q signals among the signals (sensing signals) received from Q*R touch pads TP.

The selected Q signals are transmitted to the Q sensing units SU #1, SU #2, . . . , SU #Q in the sensing unit block 412 and input to the integrator INTG through the preamplifier Pre-AMP.

The integrator INTG outputs an integral value of the output voltage of the preamplifier Pre-AMP (i.e., a touch sensing signal output to the output terminal of the preamplifier Pre-AMP).

The integrator INTG may be configured with elements, such as a comparator and a capacitor. The signal output from the integrator INTG is input to the sample and hold circuit SHA.

The sample and hold circuit SHA is a circuit added to the input terminal of the A/D converter ADC, and is configured to sample and hold voltage and to maintain the held voltage until the A/D converter terminates previous conversion. The voltage stored (held) in the sample and hold circuit SHA corresponds to the touch sensing signal.

The second multiplexer circuit 413 is a circuit for Q:1 multiplexing and may be configured with at least one multiplexer, and is configured to select one of the Q sensing units SU #1, SU #2, . . . , and SU #Q, and to inputs the voltage held in the sample and hold circuit SHA of the selected sensing unit to the A/D converter.

The A/D converter 414 converts the input voltage to a digital sensing value, and outputs the converted digital sensing value ADC Data.

The sensing data including the digital sensing value output in this way is transmitted to the touch controller 120 through the communication processor 420 of the touch sensing circuit 110.

Referring to FIG. 3 and FIGS. 4A and 4B, among three processes (a touch driving process, an ADC process, and a sensing data transmission process), the touch sensing circuit 110 may perform the ADC process after performing the touch driving process and may sequentially perform the sensing data transmission process after the ADC process is completed.

Then, the touch sensing circuit 110 may simultaneously perform the next touch driving process while performing the sensing data transmission process.

That is, after the touch sensing period is completed, the ADC period is performed, after the ADC period is completed, the sensing data transmission period is performed, and during the sensing data transmission period, the next touch sensing period is simultaneously performed.

In summary, in the touch sensing system, after the ADC period, which is performed after the touch sensing period (touch driving period) is completed, the sensing data transmission period is performed, and the sensing data transmission period and the touch sensing period are simultaneously performed.

Since the sensing data transmission period and the touch sensing period are simultaneously performed, the touch sensing period and the sensing data transmission period may have a bad influence on each other.

More specifically, by toggling of the signals (sensing data, clock signal, etc.) transmitted through the communication interface between the touch sensing circuit 110 and the touch controller 120 in the sensing data transmission period, noise (fluctuation of a voltage value) may be caused in various powers and grounds. The noise affects the touch driving signal TDS to be supplied to the touch electrode TE in the touch sensing period, and as a result, a normal touch sensing process (touch driving process) may not be performed.

In addition, in the touch sensing period (touch driving period), noise (fluctuation of a voltage value) in various powers and grounds at each of the rising time and the falling time of the touch driving signal TDS is caused, and as a result, a transmission error may occur through the communication interface between the touch sensing circuit 110 and the touch controller 120.

When the touch sensing period (touch driving period) is performed after the sensing data transmission period is completed in order to eliminate the influence between the touch sensing period and the sensing data transmission period, it takes too long to determine the presence or absence of a touch and the touch position on one screen. That is, the touch frame rate becomes too low.

Therefore, in order to avoid a mutual interference phenomenon between the touch sensing period and the sensing data transmission period without reducing the touch frame rate, it is required to reduce the number of times of toggling the touch driving signal TDS, which may lower the Signal-to-Noise Ratio (SNR).

Accordingly, the touch sensing system according to the embodiments represents a method of providing a accurate touch sensing performance by avoiding a mutual interference phenomenon between the touch sensing period and the sensing data transmission period without lowering the touch frame rate and the SNR.

As described above, in order to reduce the influence between the touch sensing period and the sensing data transmission period, the touch sensing circuit 110 according to the embodiments performs the ADC process and the sensing data transmission process (communication process) in parallel.

The touch sensing circuit 110 may be configured to be capable of starting the transmission of sensing data before all the touch sensing voltages detected through all the touch electrodes TE, to which a touch driving signal TDS is applied in the touch sensing period (touch driving period), are converted into digital sensing values, that is, before the ADC period is completed.

As described above, the touch sensing circuit 110 may be configured to perform the ADC process and the communication process (including the sensing data transmission process) with the touch controller 120 in parallel, thereby transmitting the sensing data more quickly.

In addition, since the parallel process is possible, the touch sensing circuit 110 is capable of starting the transmission of the sensing data before the ADC period is completed, and as a result, it is possible to minimize the influence between the touch sensing period and the sensing data transmission period.

For example, since the ADC process and the sensing data transmission process (communication process) are performed in parallel, the overlapping time between the sensing data transmission period and the touch sensing period is shortened. Thus, the influence, such as signal interference between a touch driving signal TDS, which is a toggle signal in the touch sensing period, and a toggle signal on the communication interface in the sensing data transmission period is reduced. As a result, touch noise (touch sensing noise), communication errors, sensing data transmission errors, and the like may be reduced, and deterioration of the touch sensing performance may be prevented.

In addition, since the ADC process and the sensing data transmission process (communication process) are performed in parallel, the touch sensing circuit 110 is able to perform three processes in a shorter time so that it is possible to increase a touch frame rate and to detect the touch information on the presence or absence of a touch and/or a touch position in a shorter time.

In addition, since the ADC process and the sensing data transmission process (communication process) are performed in parallel, a spare time may be provided, and due to the spare time, it becomes possible to increase the number of pulses of the touch driving signal TDS in the touch sensing period (touch driving period), so that the SNR can be further increased.

As described above, the touch sensing circuit 110 performs the ADC process and the sensing data transmission process (communication process) in parallel, and starts the transmission of the sensing data before the ADC process is completed.

As a method for this, the touch sensing circuit 110 may start communication for sensing data transmission at a time point T_spi_start delayed by a set delay time based on the start time T_adc_start of the ADC period.

Accordingly, the starting point of the sensing data transmission may be any point between the start time point T_adc_start of the ADC period and the end time point T_adc_end of the ADC period.

This delay time may be either a fixed value or a variable value.

In addition, the delay time may be set such that the ending time point T_adc_end of the ADC period is earlier than the completion time point T_tx_end of the sensing data transmission.

The touch sensing circuit 110 transmits the sensing data to the touch controller 120 in response to the signal received by transmitting an interrupt request IRQ to the touch controller 120 and controls the transmission timing of the interrupt request IRQ according to the delay time. Thus, it is possible to perform control such that the transmission of the sensing data starts before the ADC period is completed.

Meanwhile, the sensing data transmission period is a period in which communication is performed through a communication interface I/F between the touch sensing circuit 110 and the touch controller 120, which is also referred to as a communication period.

The communication interface I/F between the touch sensing circuit 110 and the touch controller 120 may be, for example, a Serial Peripheral Interface (SPI).

The SPI is an interface that operates in a full duplex mode which is a communication type in which the touch sensing circuit 110 and the touch controller 120 individually use independent lines (signal lines) simultaneously in order to transmit/receive data (signals and information). The SPI adopts a synchronous serial data connection method.

In the SPI, the touch sensing circuit 110 and the touch controller 120 communicate in a master-slave mode.

That is, the touch sensing circuit 110 corresponds to a slave, and the touch controller 120 corresponds to a master.

Figure 5A:
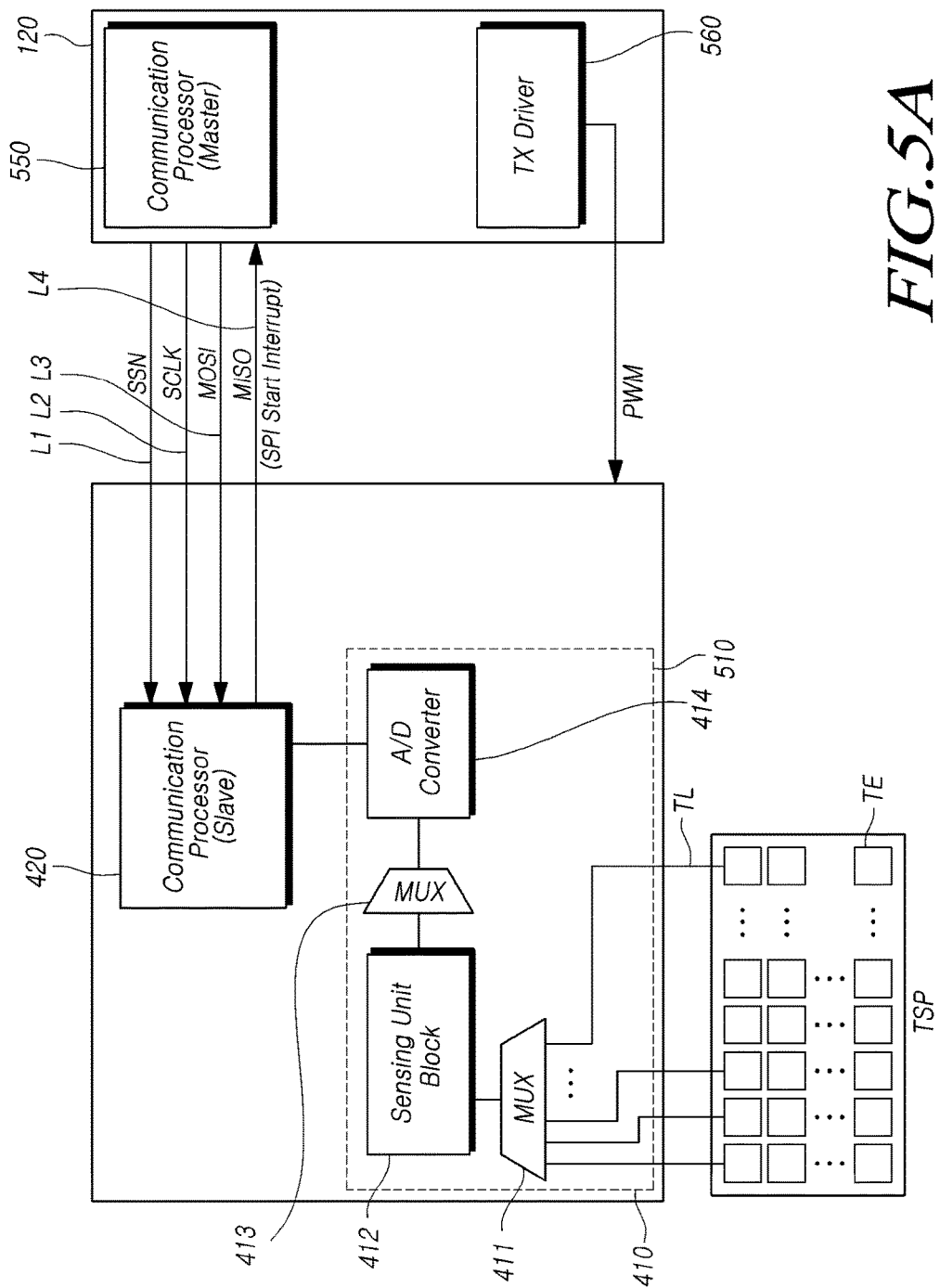
FIGS. 5A and 5B are exemplary diagrams each illustrating a touch sensing system according to the embodiment(s) of the present invention in a master-slave structure in terms of parallel process.
Figure 5B:
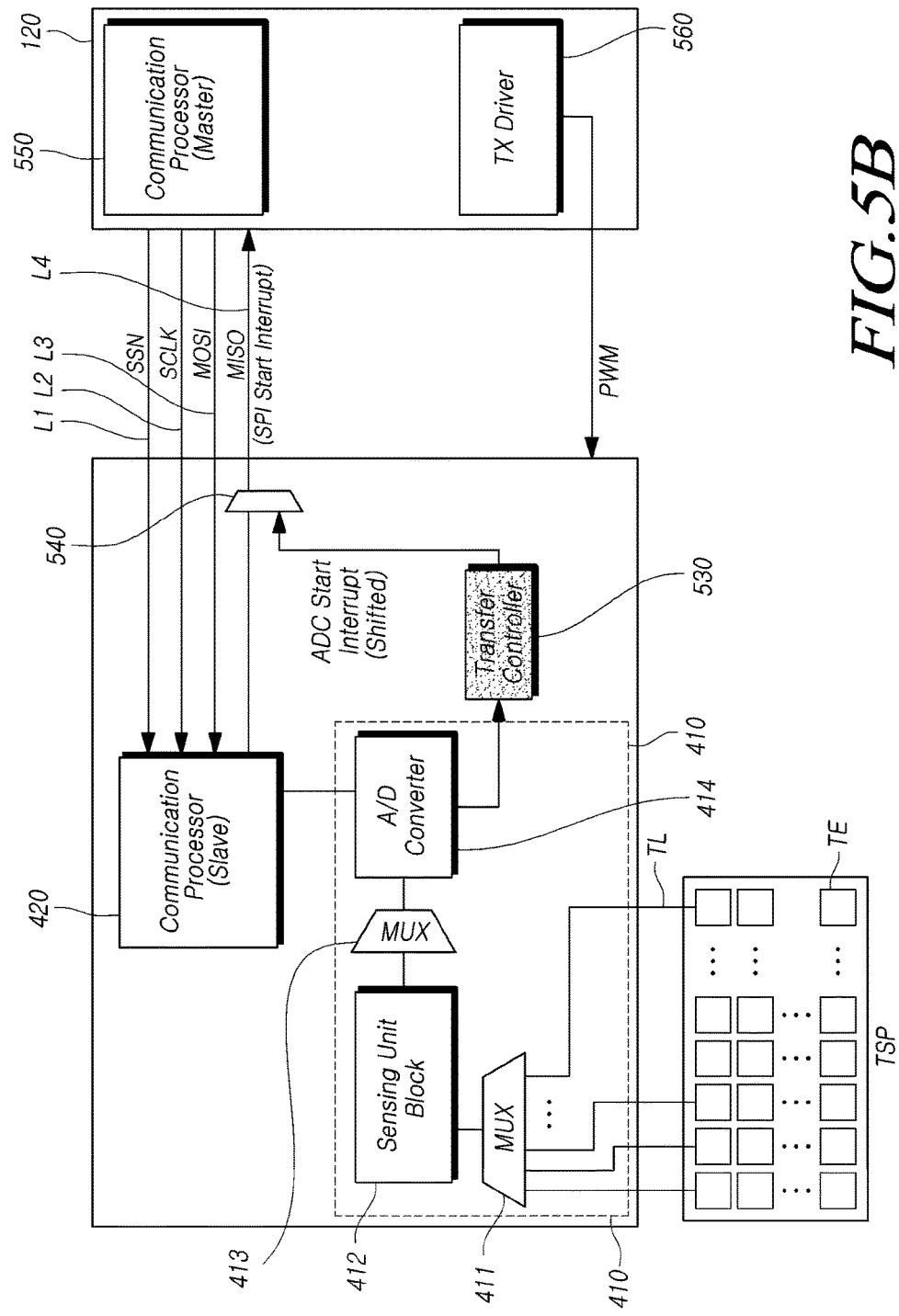
Figure 7:
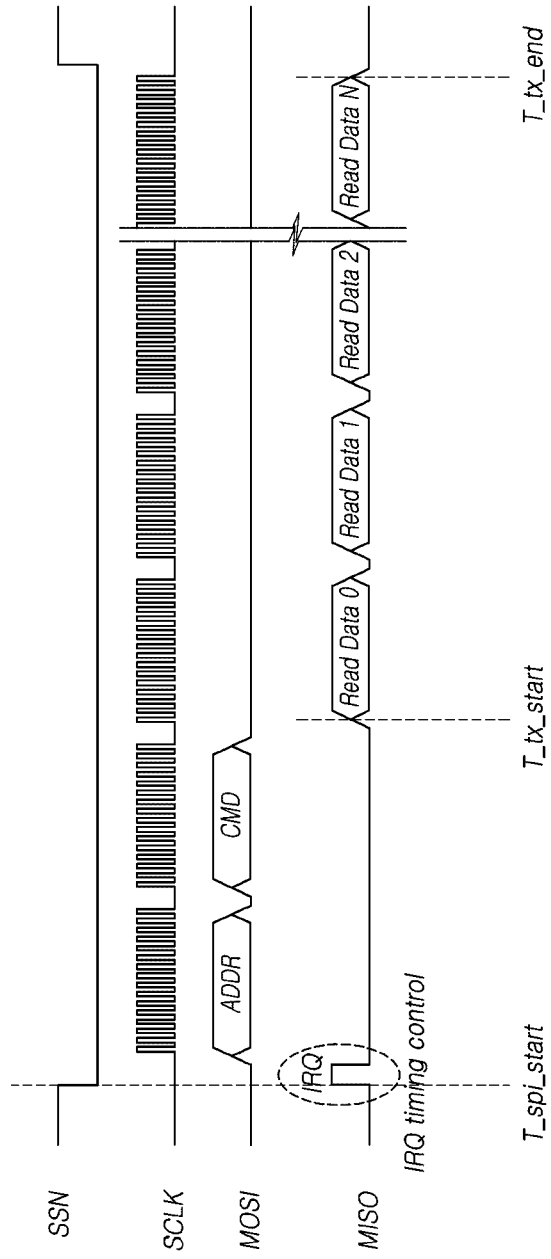
FIG. 7 is a diagram illustrating data transmission/reception through a communication interface between a touch sensing circuit and a touch controller in a touch sensing system according to the embodiments of the present invention.

FIGS. 5A and 5B are exemplary diagrams each illustrating a touch sensing system according to the present embodiment in a master-slave structure in terms of parallel process, FIG. 6 is a timing diagram illustrating parallel process of ADC and sensing data transmission in a touch sensing system according to the embodiments, and FIG. 7 is a diagram illustrating data transmission/reception through a communication interface between a touch sensing circuit 110 and a touch controller 120 in a touch sensing system according to the present embodiments. FIG. 6 is a timing diagram illustrating the sensing data transmission period S30-1 in an enlarged scale.

Referring to FIGS. 5A and 5B, the touch sensing circuit 110 may include a touch sensing processor 410, a communication processor 420 serving as a slave, and the like.

The touch controller 120 may include a communication processor 550 acting as a master, a TX driver 560, and the like.

Referring to FIGS. 5A and 5B, the communication processor 420 of the touch sensing circuit 110 and the communication processor 550 of the touch controller 120 are configured in a master-slave system structure, and performs data transmission/reception through a communication interface I/F.

Among the three processes of the touch sensing system, the touch sensing process (touch driving process) and the ADC process are performed by the touch sensing processor 410 of the touch sensing circuit 110, and the sensing data transmission process is performed by the communication processor 420 and the communication processor 550 of the touch controller 120.

The relationship of three processes of the touch sensing system (the touch sensing process (touch driving process), the ADC process, the sensing data transmission process) is summarized as follows.

Referring to FIG. 6, the touch sensing period S10-1, the ADC period S20-1, and the sensing data transmission period S30-1 in which processes for the same touch electrodes are performed correspond to the same set period.

Referring to FIG. 6, the touch sensing process (touch driving process) and the ADC process are performed sequentially.

That is, when the touch sensing period S10-1 (also referred to as "touch driving period") is completed, the ADC period S20-1 is performed, and when the ADC period S20-1 is completed, another touch sensing period S10-2 is performed.

In the touch sensing circuit 110, since the touch sensing process (touch driving process) and the ADC process are performed by the same touch sensing processor 410, the processes are sequentially performed.

The ADC process and the sensing data transmission process (communication process) may be performed in parallel. This can be enabled because the performers of the ADC process and the sensing data transmission process (communication process) are different from each other.

Accordingly, after the ADC period S20-1 is started and before the ADC period S20-1 is completed, the sensing data transmission period S30-1 (also referred to as a "communication period") may be started.

For example, the sensing data transmission period S30-1 may overlap all or a part of the ADC period S20-1.

The other touch sensing period S10-2, which is performed after the ADC period S20-1 is completed, may not overlap at all or may only partially overlap the sensing data transmission period S30-1 that is performed in parallel with the ADC period S20-1.

Referring to FIGS. 5A and 5B, the touch sensing processor 410 of the touch sensing circuit 110 may output a touch driving signal TDS to at least two touch electrodes TE during the touch sensing period S10-1, and may convert the touch sensing signal detected through each touch electrode TE, to which the touch driving signal TDS is applied during the ADC period S20-1, into a digital sensing value.

The communication processor 420 of the touch sensing circuit 110 may transmit the sensing data including the digital sensing value converted during the ADC period S20-1 to the touch controller 120. Here, the digital sensing value obtained according to the ADC may be referred to as ADC data.

The communication processor 420 of the touch sensing circuit 110 may start the transmission of the sensing data including the converted digital sensing values of the touch sensing signals detected through some touch electrodes TE before all the touch sensing signals, which are detected through two or more touch electrodes TE, respectively, are converted into digital sensing values by the touch sensing processor 410.

Referring to FIGS. 5A and 6, with reference to the ADC process state of the A/D converter 414 or the ADC-processed data (digital sensing value), the communication processor 420 of the touch sensing circuit 110 may perform control such that communication for sensing data transmission is started at a time point T_spi_start delayed by a set delay time based on a start time point T_adc_start of the ADC period S20-1.

Referring to FIG. 5B, the touch sensing circuit 110 may further include a transmission controller 530 for the purpose of controlling starting of communication with the touch controller 120.

Referring to FIGS. 5B and 6, the transmission controller 530 may perform control such that communication for sensing data transmission is started at a time point T_spi_start delayed by a set delay time based on a start time point T_adc_start of the ADC period S20-1.

As described above, by controlling the communication start time point T_spi_start for sensing data transmission to be delayed by a preset delay time based on the start time point T_adc_start of the ADC period S20-1, it is possible to perform control such that the sensing data transmission is started before the ADC period S20-1 is completed.

The communication start time point T_spi_start is a communication establishment time point for data transmission and reception between the communication processor 420 of the touch sensing circuit 110 and the communication processor 550 of the touch controller 120.

After the communication start time point T_spi_start, information exchange and processing for communication between the communication processor 420 of the touch sensing circuit 110 and the communication processor 550 of the touch controller 120 are performed.

The communication processor 420 of the touch sensing circuit 110 actually transmits the sensing data at a transmission time point T_tx_start after information exchange and processing for communication are performed.

Meanwhile, the rate, at which the digital sensing value is output from the A/D converter 414 and transmitted to the communication processor 420, may be affected by ADC processing speed (also referred to as "processing rate"), which corresponds to the inherent performance of the A/D converter 414, and may also vary depending on how many sensing units SU are connected to the A/D converter 414.

For example, even if the ADC processing rate, which corresponds to the inherent performance of the A/D converter 414, is high, when the number of the sensing units SU in the sensing unit block 412 connected to the input terminal of the A/D converter 414 is structurally too large so that the input rate at which a touch sensing signal is input to the A/D converter 414 through the multiplexer circuit 413 is low, a rate at which a digital sensing value is output from the A/D converter 414 to be transmitted to the communication processor 420 will be slowed down.

When the rate at which the digital sensing value is output from the A/D converter 414 and is transmitted to the communication processor 420 is slowed down, a phenomenon in which sensing data to be transmitted to the touch controller 120 is exhausted may occur in the communication processor 420.

Therefore, the above-mentioned delay time is set such that the end time point T_adc_end of the ADC period S20-1 is earlier the completion time point T_tx_end of the sensing data transmission or the communication end time point T_spi_end.

As described above, when the delay time is set such that the end time point T_adc_end of the ADC period S20-1 is earlier than the completion time point of the sensing data transmission, it is possible to prevent the phenomenon in which sensing data to be transmitted is exhausted.

In general, it may be desirable that the ADC processing rate is higher than the communication rate (sensing data transmission rate) between the touch sensing circuit 110 and the touch controller 120.

However, a situation may occur in which the ADC processing rate is lower than the communication rate (sensing data transmission rate) between the touch sensing circuit 110 and the touch controller 120. In this case, the phenomenon may occur in which the sensing data to be transmitted is exhausted, and the phenomenon may be prevented by setting a delay time.

The above-mentioned transmission controller 530 controls the communication start time point so as to generate an ADC start interruption, and the communication processor 420 of the touch sensing circuit 110 may generate an interrupt request IRQ for starting communication (SPI communication) (SPI start interrupt) with the communication processor 550 of the touch controller 120 according to the ADC start interrupt.

On the other hand, when the communication situation between the touch sensing circuit 110 and the touch controller 120 is variable, the delay time may be variably set.

Meanwhile, the transmission controller 530 may further include, for example, a delay component 540, such as a shift register or an arithmetic calculator, internally or externally.

When the transmission controller 530 is implemented as a shift register, the delay time may be a shift register value.

Referring to FIGS. 5A and 5B, and FIGS. 6 and 7, the communication interface between the touch sensing circuit 110 and the touch controller 120 may be, for example, a Serial Peripheral Interface (SPI).

Referring to FIGS. 5A and 5B, the communication interface between the touch sensing circuit 110 and the touch controller 120 includes a slave selection signal line L1, a clock signal line L2, a master data output line L3, a slave data output line L4, and the like.

The slave selection signal line L1 is a line for outputting a slave selection signal SSN for selecting the touch sensing circuit 110 in which the touch controller 120 is to perform a touch sensing operation.

When the touch sensing circuit 110 is implemented with an integrated circuit chip, the slave selection signal SSN may also be referred to as a chip selection signal. In this case, the slave selection signal line L1 may also be referred to as a chip selection signal line.

The clock signal line L2 is a line for transmitting a clock signal SCLK from the touch controller 120 to the touch sensing circuit 110.

The master data output line L3 is a line for transferring a master data MOSI from the touch controller 120 to the touch sensing circuit 110.

The slave data output line L4 is a line for transferring slave data MISO from the touch sensing circuit 110 to the touch controller 120.

The touch controller 120 may transmit, through the master data output line L3, the master data MOSI in synchronization with the clock signal SCLK transmitted through the clock signal line L2.

Here, the master data MOSI includes, as write data, information (e.g., ADDR and CMD) required for communication with the touch sensing circuit 110 or information required for controlling the operation of the touch sensing circuit 110.

The touch sensing circuit 110 may transmit, through the slave data output line L4, the slave data MISO in synchronization with the clock signal SCLK transmitted through the clock signal line L2.

Here, the slave data MISO may include, as read data, sensing data or the like that is generated through the touch-driving of the touch sensing circuit 110.

As described above, since the touch controller 120 transmits the master data MOSI in synchronization with the clock signal SCLK, the touch sensing circuit 110 may accurately read the master data MOSI transmitted from the touch controller 120. In addition, since the touch sensing circuit 110 transmits the slave data MISO in synchronization with the clock signal SCLK, the touch controller 120 may accurately read the slave data MISO transmitted from the touch sensing circuit 110.

Referring to FIG. 7, the communication processor 420 of the touch sensing circuit 110 transmits an interrupt request IRQ corresponding to the slave data MISO to the touch controller 120 via the slave data output line L4.

The communication processor 420 of the touch sensing circuit 110 may transmit sensing data corresponding to read data Read Data 0, Read Data 1, Read Data 2, ..., and Read Data N to the touch controller 120 via the data line L4, in response to the signals SCLK, ADDR, and CMD received via the clock signal line L2 and/or the master data output line L3.

Meanwhile, the clock signal SCLK transmitted through the clock signal line L2 may include: a clock signal indicating a transmission period of memory address information ADDR of the touch sensing circuit 110, which is transmitted via the master data output line L3; a clock signal indicating the transmission period of command information CMD (e.g., Read) related to a touch sensing operation, which is transmitted via the master data output line L3; and a clock signal indicating a transmission period of the sensing data corresponding to the read data, which is transmitted via the slave data output line L4.

The transmission controller 530 may control the transmission timing of the interrupt request IRQ according to the preset delay time such that sensing data transmission is controlled to be started before the ADC period S20-1 is completed.

According to the above description, by controlling the transmission (generation) time point of the interrupt request IRQ defined in the protocol of a communication interface, it is possible to efficiently control the communication start time between the touch sensing circuit 110 and the touch controller 120 for sensing data transmission.

The communication processor 420 of the touch sensing circuit 110 may transmit the interrupt request IRQ to the touch controller 120 and may then transmit the sensing data to the touch controller 120 according to the clock signal SCLK received from the touch controller 120.

Accordingly, the touch controller 120 may accurately receive and recognize the slave data MISO including the read data, which is the sensing data transmitted from the touch sensing circuit 110.

Meanwhile, the TX driver 560 of the touch controller 120 provides a pulse signal (e.g., Pulse Width Modulation (PWM) signal) to the touch sensing circuit 110.

The touch sensing circuit 110 supplies the touch driving signal TDS to the touch screen panel TSP according to the received pulse signal.

The touch controller 120 may supply a pulse signal (e.g., a PWM signal) to the touch sensing circuit 110 only in a touch sensing period.

As another example, the touch controller 120 may stop supplying the pulse signal in at least a part of the sensing data transmission period (SPI communication period).

That is, the influence of various kinds of noise may be minimized by preventing the time period, in which the pulse signal is generated by the touch controller 120, from overlapping the sensing data transmission period as much as possible (to at least partially or not overlap each other).

As described above, the touch sensing processor 410 of the touch sensing circuit 110 outputs a touch driving signal TDS to at least two touch electrodes TE, and performs the ADC of a touch sensing signal, which is detected through each touch electrode TE, into a digital sensing value.

In addition, the communication processor 420 of the touch sensing circuit 110 transmits, to the touch controller 120, digital sensing values subjected from the ADC by the touch sensing processor 410 when the digital sensing values are obtained by a predetermined number or during a predetermined time, rather than transmitting the sensing data after all the digital sensing values for the touch sensing voltages detected through all the touch electrodes TE, to which the touch driving signal TDS is applied by the touch sensing processor 410, are obtained.

Here, the predetermined time in which the digital sensing value is obtained by the ADC by the touch sensing processor 410 may correspond to the above-mentioned delay time.

In addition, the predetermined time required for obtaining a predetermined number of digital sensing values obtained by the ADC by the touch sensing processor 410 may correspond to the above-mentioned delay time.

According to the above description, the touch sensing circuit 110 may provide sensing data, which corresponds to a partial result of the ADC, to the touch controller 120 in real time while the ADC is performed. Accordingly, the touch controller 120 may quickly detect the presence or absence of a touch and/or a touch position.

Meanwhile, the touch sensing circuit 110 may further include a processor control unit (not illustrated) that centrally controls the operations of the touch sensing processor 410 and the communication processor 420 in order to perform the ADC process and the sensing data transmission process (communication process) in parallel.

In the following, the parallel process of ADC and sensing data transmission described above will be described by way of an example.

Figure 8:
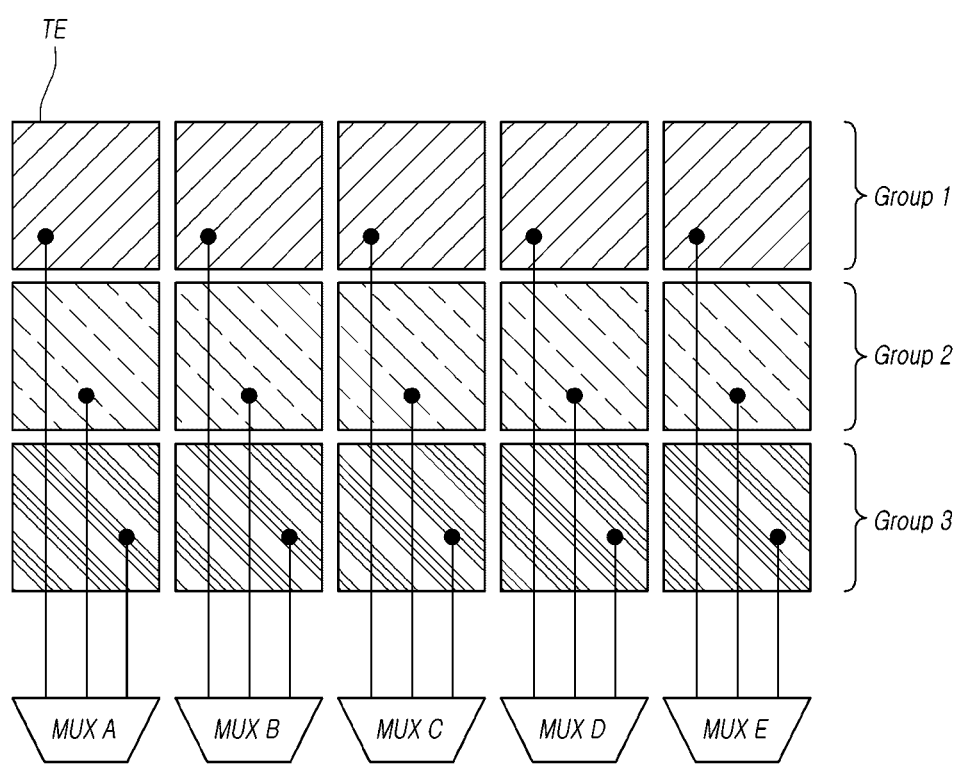
FIG. 8 is a diagram illustratively illustrating a driving structure of a touch screen panel according to the embodiments of the present invention.

To this end, FIG. 8 illustrates a driving structure of a Touch Screen Panel (TSP) for exemplary illustration.

FIG. 8 is a diagram illustratively illustrating a driving structure of a TSP according to the embodiments.

Referring to FIG. 8, it is assumed that when three rows and five columns of touch electrodes TE are arranged on a TSP according to the embodiments, the five touch electrode columns are driven by five multiplexers MUX A, MUX B, MUX C, MUX D, and MUX E.

That is, it is assumed that the MUX A drives the first touch electrode column, the MUX B drives the second touch electrode column, the MUX C drives the third touch electrode column, the MUX D drives the fourth touch electrode column, and MUX E drives the fifth touch electrode column.

The first touch electrode row may be simultaneously driven by being supplied with a touch driving signal TDS through the first channels of the five multiplexers MUX A, MUX B, MUX C, MUX D, and MUX E. Therefore, the first touch electrode row will be referred to as group 1.

The second touch electrode row may be simultaneously driven by being supplied with a touch driving signal TDS through the second channels of the five multiplexers MUX A, MUX B, MUX C, MUX D, and MUX E. Therefore, the second touch electrode row will be referred to as group 2.

The third touch electrode row may be simultaneously driven by being supplied with a touch driving signal TDS through the third channels of the five multiplexers MUX A, MUX B, MUX C, MUX D, and MUX E. Therefore, the third touch electrode row will be referred to as group 3.

Figure 9:
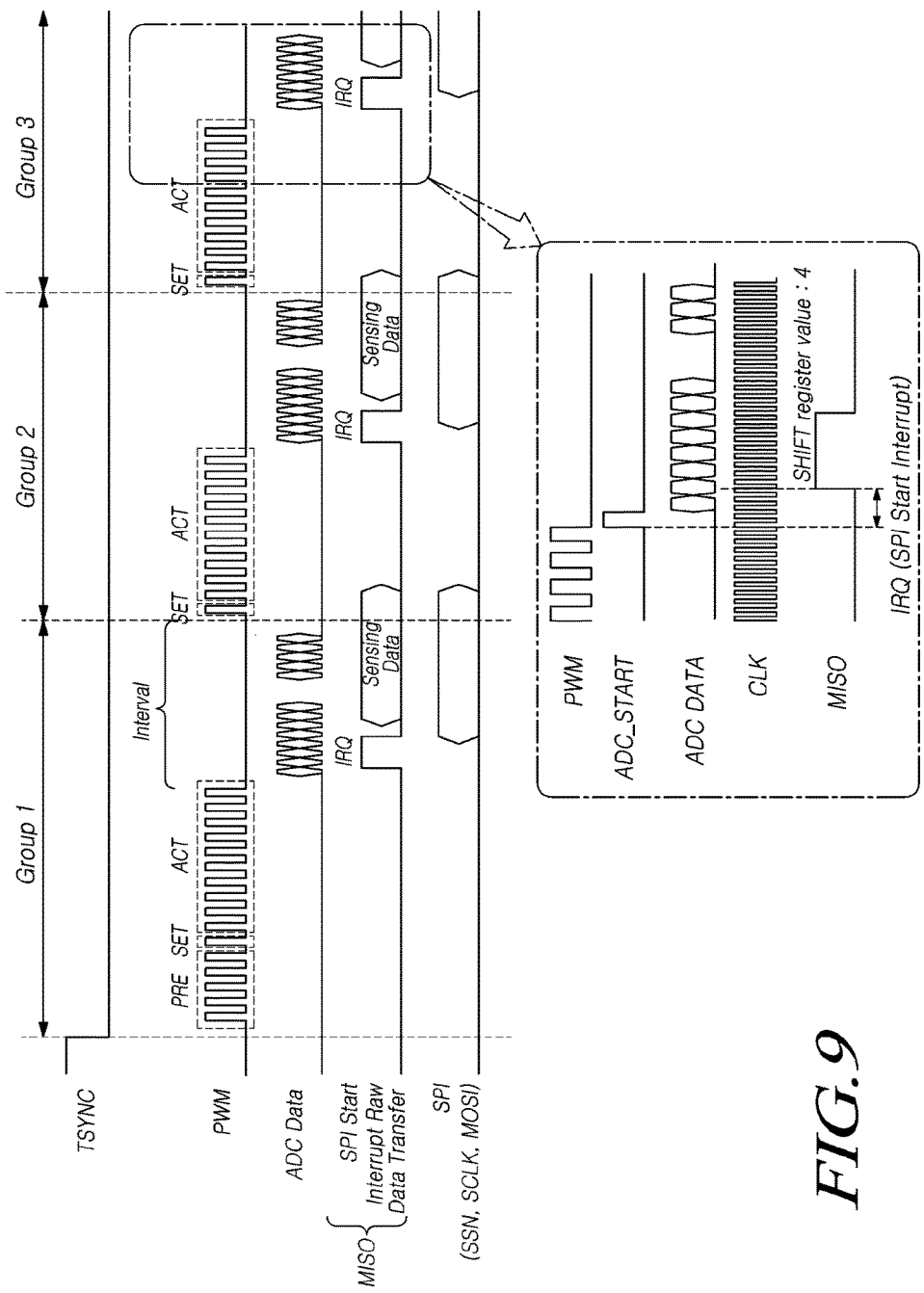
FIG. 9 is an exemplary diagram illustrating parallel process of analog-to-digital conversion and sensing data transmission in a touch sensing system according to the embodiments of the present invention.

FIG. 9 is an exemplary diagram illustrating parallel process of ADC and sensing data transmission in a touch sensing system according to the embodiments.

Referring to FIG. 9, the display mode period and the touch sensing mode period may be defined by a synchronization signal TSYNC.

When the synchronization signal TSYNC is low level (or high level), it may be a touch sensing mode period, and when the synchronization signal TSYNC is high level (or low level), it may be a display mode period.

According to the example of FIG. 9, during one touch sensing mode period, all of group 1, group 2, and group 3 are driven.

In order to stabilize a voltage at the touch electrodes TE, an idle period (interval) may exist between the touch driving period (touch sensing period) of group 1 and the touch driving period (touch sensing period) of the group 2, and between the touch driving period (touch sensing period) of group 2 and the touch driving period (touch sensing period) of group 3.

During the touch driving period (touch sensing period) for group 1, which is the first group in the touch sensing mode period, the touch driving signal TDS supplied to the first touch electrode row included in group 1 may include one or more pre-pulses (pre-dummy pulse) PRE.

The one or more pre-pulses PRE are intended to reduce the influence in the display mode period before the touch sensing mode period.

In the case where the touch screen panel TSP is embedded in the display panel DP, i.e., when the touch electrodes TE are built-in the display panel DP, and when the touch electrodes are also used during the driving of the display, the one or more pre-pulses (PRE) enable the touch electrodes TE to be quickly driven in a touch sensing mode period that is performed after the display mode period, thereby enabling a accurate touch sensing process (touch driving process).

Also, the driving signal TDS, which is supplied to the touch electrode row included in each group during the touch driving period (touch sensing period) for each group in the touch sensing mode period, includes one or more setting pulses SET and a plurality of active pulses ACT.

The plurality of active pulses ACT are practical touch driving signals.

That is, touch information is detected by the touch sensing voltage detected in response to the plurality of active pulses ACT.

The one or more setting pulses SET serve to inform the frequency of the plurality of active pulses ACT.

That is, the one or more setting pulses SET and the plurality of active pulses ACT have the same frequency.

For example, in the case of a PWM signal, the pulse width of the setting pulses SET and the pulse width of the active pulses ACT may be the same.

The above-mentioned one or more pre-pulses PRE and one or more setting pulses SET are not the pulses used in the practical touch sensing process.

Referring to FIG. 9, for group 1, the touch sensing process (touch driving process) is performed, and then the ADC process is performed.

Digital data ADC Data corresponding to a digital sensing value is generated according to the ADC process.

The touch sensing circuit 110 transmits an interrupt request IRQ to the touch controller 120 as the slave output data MISO before the ADC process is completed.

According to the signals SSN, SCLK, and MOSI received from the touch controller 120, the touch sensing circuit 110 transmits, as slave output data MISO, sensing data including a digital sensing value ADC Data obtained during the ADC process.

While the sensing data transmission process for group 1 is performed, the touch sensing process (touch driving process) for group 2 is performed.

At this time, the sensing data transmission period for group 1 and the touch sensing period for group 2 may not overlap or may partially overlap as in FIG. 9.

Among a plurality of pulses constituting a touch driving signal TDS in the touch sensing period for group 2, the pulses overlapping the sensing data transmission period for group 1 may be the setting pulses SET.

Referring to FIG. 9, a method of triggering a sensing data transmission process, which may be performed in parallel with the ADC process will be described as an example.

The touch sensing circuit 110 may generate an ADC start signal ADC_START and may start the ADC process when all the touch drive signals TDS are supplied so that the touch driving process (touch sensing process) is completed.

The touch sensing circuit 110 generates an interrupt request IRQ indicating the start of SPI communication to be shifted by a shift register value (SHIFT register value=4) (which may be the number of pulses) corresponding to a preset delay time from the generation time point T_adc_start of the ADC start signal ADC_START, based on an internal clock CLK.

Referring to FIG. 9, the front portion of the sensing data transmission period in which the sensing data is transmitted to the touch controller 120 overlaps all or a part of the ADC period.

The rear portion of the sensing data transmission period in which the sensing data is transmitted to the touch controller 120 may not overlap or may partially overlap another touch sensing period that is performed after the ADC period.

Accordingly, the sensing data may be provided to the touch controller 120 more quickly so that the touch information can be detected quickly. In addition, the overlapping period between the sensing data transmission period and the touch driving signal transmission period (touch sensing period) is shortened, so that noise can be suppressed and SNR can be improved.

As described above, the touch driving signal TDS may include, for example, one or more control pulses (i.e., one or more setting pulses SET) output during a period that overlaps the sensing data transmission period, and one or more active pulses ACT that are output during the period that does not overlap or partially overlap the sensing data transmission period.

Here, the control pulses SET and the active pulses ACT may have the same frequency. For example, in the case of a PWM signal, the control pulses SET and the active pulses ACT have the same pulse width.

The touch controller 120 may determine touch information based on the converted digital sensing value of the touch sensing signal detected in response to the one or more active pulses ACT included in the touch driving signal TDS.

Using the control pulses SET described above, the devices within the touch sensing system may clearly recognize the frequency of the active pulses ACT, which is a practical driving signal, and thus may perform various processes in accordance with the frequency.

As described above, when the display mode period and the touch sensing mode period are separated from each other in terms of time, that is, when the display mode period and the touch sensing mode period are performed in a time-divisional manner, and in the case of operating in a vertical blank driving manner, the touch display device 100 may time-divide one image frame period into one display mode period D and one touch sensing mode period T, may display one image frame during one display mode period D, and may sense touch in the entire screen region or in a partial region (e.g., a half region or the like) of the screen during one touch sensing mode period T.

Alternatively, in the case of operating in a horizontal blank driving mode, the touch display device 100 may time-divide one video frame period into two or more display mode modes D1, D2, . . . and two or more touch sensing mode periods T1, T2, . . . , may display one image frame while passing through the two or more display mode periods D1, D2, . . . and may sense touch in the entire screen region or in a partial region (e.g., a half region or the like) of the screen while passing through the two or more touch sensing mode periods T1, T2, . . . .

The touch sensing operation in each of the vertical blank driving method and the horizontal blank driving method will be described below.

Figure 10:
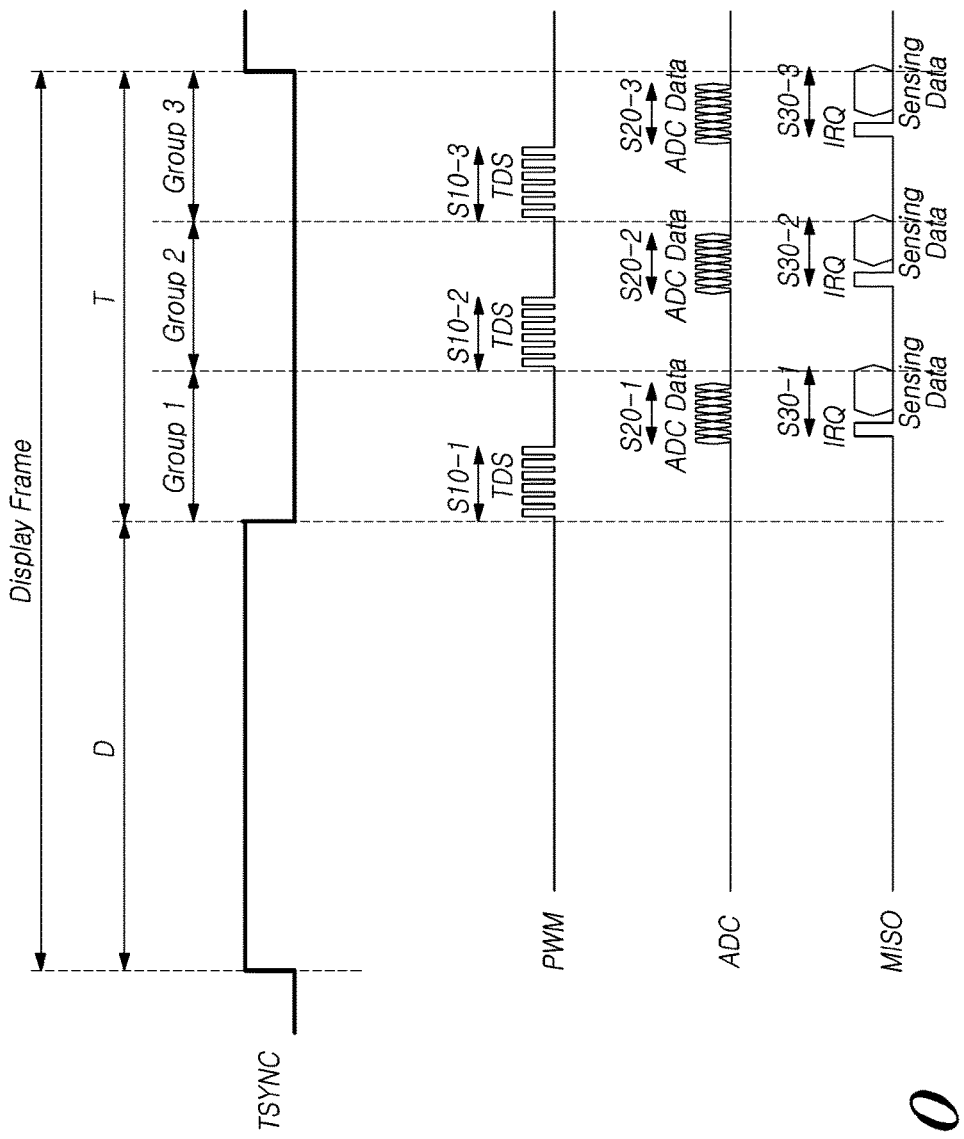
FIG. 10 is a timing diagram of a touch sensing operation in a vertical blank driving method of a touch display device according to the embodiments of the present invention.

FIG. 10 is a timing diagram of a touch sensing operation in a vertical blank driving method of a touch display device 100 according to the embodiments.

Referring to FIG. 10, in the case of operating in the vertical blank driving manner, the touch display device 100 may time-divide one image frame period into one display mode period D and one touch sensing mode period T, may display one image frame during one display mode period D, and may sense touch in the entire screen region or in a partial region (e.g., a half area or the like) of the screen during one touch sensing mode period T.

During the touch sensing period T, a touch driving process (touch sensing process S10-1), an ADC process S20-1, and a sensing data transmission process S30-1 are performed for the group 1, a touch driving process (touch sensing process S10-2), an ADC process S20-2, and a sensing data transmission process S30-2 are performed for group 2, and a touch driving process (touch sensing process S10-3), an ADC process S20-3, and a sensing data transmission process S30-3 are performed for group 3.

For group 1, the ADC process S20-1 and the sensing data transmission process S30-1 may be performed in parallel.

For group 2, the ADC process S20-2 and the sensing data transmission process S30-2 may be performed in parallel.

For group 3, the ADC process S20-3 and the sensing data transmission process S30-3 may be performed in parallel.

The sensing data transmission process S30-1 for group 1 and the touch driving process (touch sensing process S10-2) for group 2 may be performed in completely different time zones or may overlap in some time periods.

The sensing data transmission process S30-2 for group 2 and the touch driving process (touch sensing process S10-3) for group 3 may be performed in completely different time zones or may overlap in some time periods.

In other words, the front portions of the sensing data transmission periods S30-1, S30-2, and S30-3 in which the sensing data is transmitted to the touch controller 120 are provided to overlap the entire ADC periods S20-1, S20-2, and S20-3 or the partial periods of the ADC periods S20-1, S20-2, and S20-3.

The rear portions of the sensing data transmission periods S30-1 and S30-2 in which the sensing data is transmitted to the touch controller 120 may not overlap or may partially overlap the touch sensing periods S10-2 and S10-3 for the next group.

According to the above-described method, the sensing data is quickly provided to the touch controller 120 under the method of driving one touch sensing mode period in a plurality of groups, so that the touch information can be detected quickly. In addition, the overlapping period between the sensing data transmission period and the touch driving signal transmission period (touch sensing period) may be shortened, so that noise can be suppressed and SNR can be improved.

Figure 11:
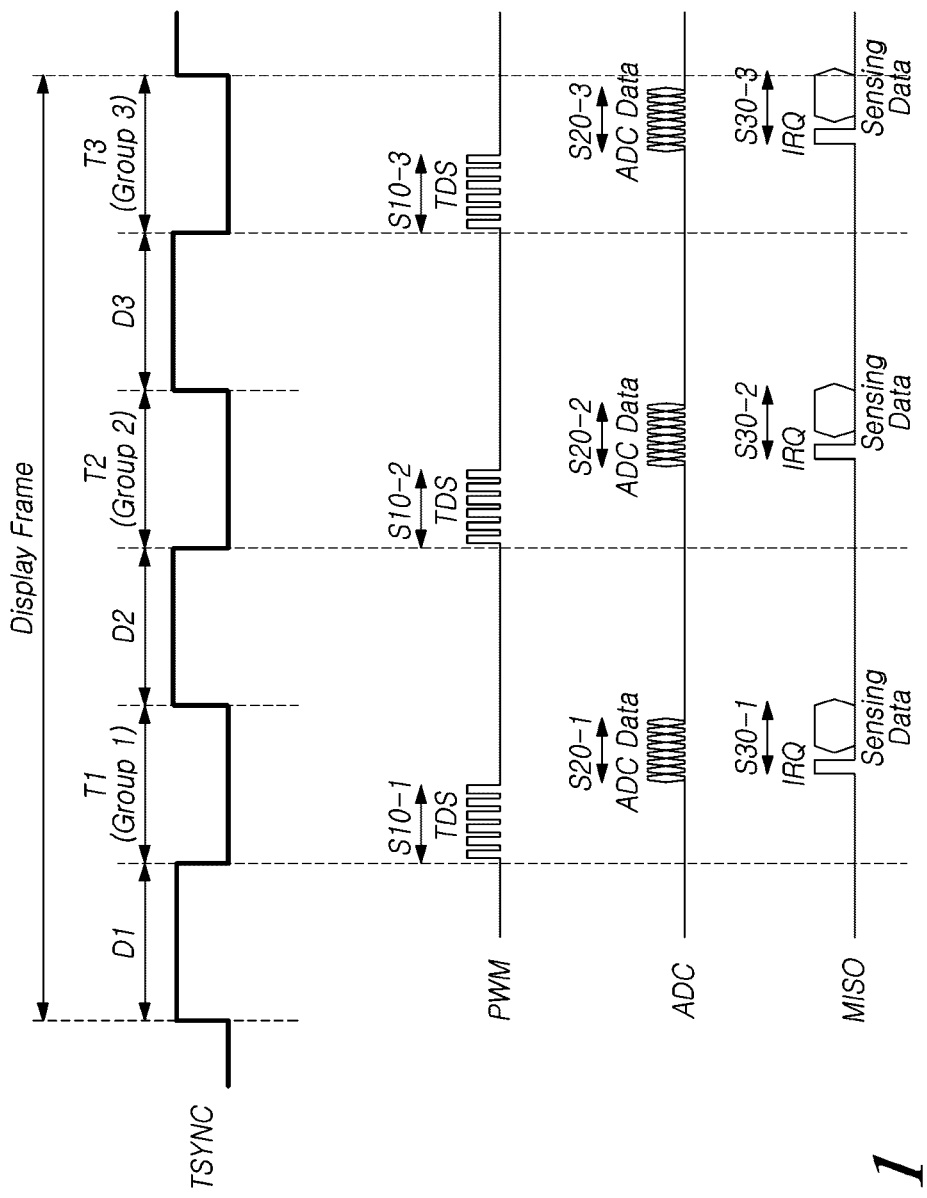
FIG. 11 is a timing diagram of a touch sensing operation in a horizontal blank driving method of a touch display device according to the embodiments of the present invention.

FIG. 11 is a timing diagram of a touch sensing operation in a vertical blank driving method of the touch display device 100 according to the embodiments.

Referring to FIG. 11, in the case of operating in a horizontal blank driving mode, the touch display device 100 may time-divide one video frame period into three display mode periods D1, D2, and D3 and three touch sensing mode periods T1, T2, and T3, may display one image frame while passing through the three display mode periods D1, D2, and D3 and may sense touch in the entire screen region or in a partial region (e.g., a half region or the like) of the screen while passing through the three touch sensing mode periods T1, T2, and T3.

During the first touch sensing mode period T1, a touch driving process (touch sensing process S10-1), an ADC process S20-1, and a sensing data transmission process S30-1 may be performed for group 1.

During the second touch sensing mode period T2, a touch driving process (touch sensing process S10-2), an ADC process S20-2, and a sensing data transmission process S30-2 may be performed for group 2.

During the third touch sensing mode period T3, a touch driving process (touch sensing process S10-3), an ADC process S20-3, and a sensing data transmission process S30-3 may be performed for group 3.

For group 1, the ADC process S20-1 and the sensing data transmission process S30-1 may be performed in parallel.

For group 2, the ADC process S20-2 and the sensing data transmission process S30-2 may be performed in parallel.

For group 3, the ADC process S20-3 and the sensing data transmission process S30-3 may be performed in parallel.

During or after the sensing data transmission process S30-1 for group 1 is performed, the display mode period D2 may performed.

During or after the sensing data transmission process S30-2 for group 2 is performed, the display mode period D3 may performed.

During or after the sensing data transmission process S30-3 for group 3 is performed, the display mode period D1 may performed.

In other words, the front portions of the sensing data transmission periods S30-1, S30-2, and S30-3 in which the sensing data is transmitted to the touch controller 120 are provided to overlap the entire ADC periods S20-1, S20-2, and S20-3 or the partial periods of the ADC periods S20-1, S20-2, and S20-3.

The rear portions of the sensing data transmission periods S30-1 and S30-2 in which the sensing data is transmitted to the touch controller 120 may not overlap or may partially overlap the display mode periods D2, D3, and D1.

Alternatively, the display mode periods D2, D3, and D1 may be performed after the sensing data transmission periods S30-1 and S30-2.

According to the above description, under the method of driving one touch sensing mode period as one group, the sensing data may be quickly provided to the touch controller 120 so that the touch information can be quickly detected and the influence by the touch sensing period on the display mode period can be reduced. In addition, the overlapping period between the sensing data transmission period and the touch driving signal transmission period (touch sensing period) may be removed, so that noise can be suppressed and SNR can be improved.

A touch sensing method according to the above-described embodiments of the present invention will be briefly described.

Figure 12:
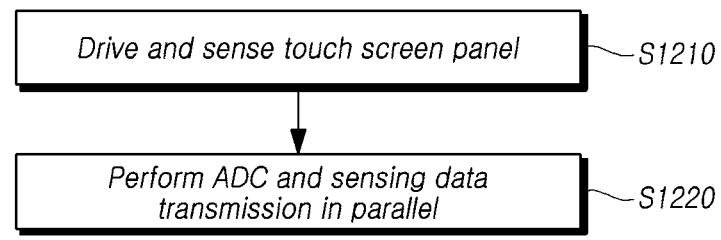
FIG. 12 is a flowchart of a touch sensing method according to the embodiments of the present invention.

FIG. 12 is a flowchart of a touch sensing method according to the embodiments.

Referring to FIG. 12, the touch sensing method according to the present exemplary embodiment may include: a step in which the touch sensing circuit 110 drives the touch screen panel TSP to detect information needed for touch information detection (S1210); and a step in which the touch sensing circuit 110 performs ADC of a touch sensing signal detected through each touch electrode TE into a digital sensing value, and starts a communication process for transmitting sensing data including a digital sensing value obtained by the ADC to the touch controller 120 (S1220).

In step S1210, the touch sensing circuit 110 outputs a touch driving signal TDS to at least two touch electrodes TE to drive the touch screen panel TSP, and as a result, a touch sensing signal is detected through the touch electrodes TE to which the touch driving signal TDS is applied.

In step S1220, before the ADC for the touch sensing voltage detected through each of the two or more touch electrodes TE is completed, sensing data including a digital sensing value obtained through the ADC for the touch sensing voltage detected through some touch electrodes TE may be transmitted.

When the above-described touch sensing method is used, the ADC process and the sensing data transmission process (communication process) are performed in parallel in the touch sensing circuit 110 so that the sensing data transmission is started before the ADC period is completed. Thus, influence between the touch sensing period and the sensing data transmission period is minimized, so that it is possible to reduce touch noise (touch sensing noise), communication errors, sensing data transmission errors, etc. and to prevent the deterioration of the touch sensing performance.

In addition, since the ADC process and the sensing data transmission process (communication process) are performed in parallel, it is possible to increase a touch frame rate and to detect the touch information on the presence or absence of a touch and/or a touch position in a shorter time.

In addition, since the ADC process and the sensing data transmission process (communication process) are performed in parallel, spare time may be provided, and due to the spare time, it becomes possible to increase the number of pulses in the touch sensing period (touch driving period), so that the SNR can be increased.

Figure 14:
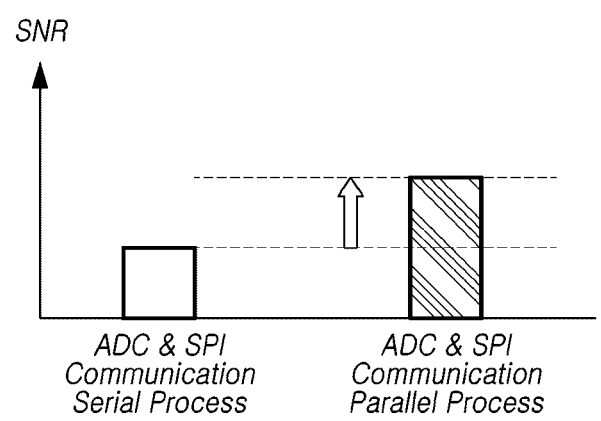
FIG. 14 is a diagram illustrating Signal-to-Noise Ratios (SNRs) depending on presence or absence of a parallel process of analog-to-digital conversion and sensing data transmission in a touch sensing system according to the embodiments of the present invention in comparison.

FIG. 13 is a diagram illustrating noises depending on presence or absence of a parallel process of ADC and sensing data transmission in a touch sensing system according to the embodiments in comparison, and FIG. 14 is a diagram illustrating SNRs depending on presence or absence of a parallel process of analog-to-digital conversion and sensing data transmission in a touch sensing system according to the embodiments in comparison.

FIG. 13 illustrates graphs illustrating the results of noise strength size simulations, in which noise distributions of touch sensing signals detected through each of the touch electrodes TE arranged on the touch screen panel TSP or digital sensing values thereof are illustrated for the case of performing an ADC process and a sensing data transmission process (SPI communication process) sequentially and the case of performing an ADC process and a sensing data transmission process (SPI communication process) in parallel.

As illustrated in FIG. 13, when the ADC process and the sensing data transmission process (SPI communication process) are performed in parallel, it can be seen that the noise size is largely reduced in most regions.

FIG. 14 is a graph illustrating the results of SNR measurements, i.e., the results obtained by averaging ratios of touch sensing signal and noise detected through each touch electrode TE arranged in the touch screen panel TSP, i.e., signal-to-noise ratios (SNRs) for the case of performing an ADC process and a sensing data transmission process (SPI communication process) sequentially and the case of performing an ADC process and a sensing data transmission process (SPI communication process) in parallel.

As illustrated in FIG. 14, when the ADC process and the sensing data transmission process (SPI communication process) are performed in parallel, it can be seen that the SNR is greatly increased because the noise is greatly reduced.

According to the embodiments described above, it is possible to provide a touch sensing circuit 110, a touch display device 100, and a touch sensing method that are capable of improving touch sensitivity by reducing noise generated in the process of detecting touch information and improving the signal-to-noise ratio.

In addition, according to the embodiments disclosed above, it is possible is to provide a touch sensing circuit 110, a touch display device 100, and a touch sensing method that enable quick touch sensing.

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the essential features of the present invention. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. A touch sensing device comprising a touch sensing circuit including:

a touch sensing processor configured to output a touch driving signal to at least two touch electrodes during a touch sensing period, and to convert first and second touch sensing signals respectively detected through the at least two touch electrodes, to which the touch driving signal is applied, during an analog-to-digital conversion period, into first and second digital sensing values corresponding to the first and second touch sensing signals, respectively; and a communication processor configured to transmit sensing data including the first and second digital sensing values converted during the analog-to-digital conversion period to a touch controller, wherein the communication processor starts transmission of the sensing data including the first digital sensing value obtained by analog-to-digital conversion of the first touch sensing signal before analog-to-digital conversation of the second touch sensing signal is completed.

2. The touch sensing device of claim 1, further comprising:

a transmission controller configured to control communication for sensing data transmission to be started at a time point delayed by a preset delay time based on a start time of the analog-to-digital conversion period.

3. The touch sensing device of claim 2, wherein the delay time is set such that an end time of the analog-to-digital conversion period is earlier than a completion time of the sensing data transmission.

4. The touch sensing device of claim 2, wherein the communication processor is configured to transmit the sensing data to the touch controller in response to a signal received by transmitting an interrupt request to the touch controller, and the transmission controller is configured to control the transmission timing of the interrupt request according to the delay time such that the sensing data transmission is started before the analog-to-digital conversion period is completed.

5. The touch sensing device of claim 4, wherein the communication processor is configured to transmit the sensing data to the touch controller according to a clock signal received from the touch controller after transmitting the interrupt request to the touch controller.

6. The touch sensing device of claim 1, wherein a front portion of the sensing data transmission period in which the first digital sensing value is transmitted to the touch controller entirely or partially overlaps the analog-digital conversion period, and a rear portion of the sensing data transmission period does not overlap or partially overlaps another touch sensing period that is performed after the analog-to-digital conversion period.

7. The touch sensing device of claim 1, wherein a front portion of the sensing data transmission period in which the sensing data is transmitted to the touch controller entirely or partially overlaps the analog-digital conversion period, and wherein a display mode period is performed after the sensing data transmission period, or a rear portion of the sensing data transmission period overlaps the display mode period.

8. The touch sensing device of claim 1, wherein the touch driving signal includes at least one control pulse output during a period that overlaps a sensing data transmission period, and at least one active pulse output during a period that does not overlap the sensing data transmission period, and the touch controller is configured to determine touch information based on the digital sensing value obtained by converting a touch sensing signal detected in response to the at least one active pulse included in the touch driving signal.

9. The touch sensing device of claim 8, wherein the control pulse and the active pulse have same frequency.

10. The touch sensing device of claim 1, further comprising:

a touch screen panel on which the at least two touch electrodes are arranged, wherein the touch controller is configured to detect touch information by receiving the sensing data.

11. The touch sensing device of claim 10, wherein the touch sensing circuit is configured to perform a sensing data transmission process and an analog-to-digital conversion process in parallel.

12. The touch sensing device of claim 10, wherein the communication processor is configured to start communication for sensing data transmission at a time point delayed by a set delay time based on a start time of the analog-to-digital conversion period.

13. The touch sensing device of claim 12, wherein the delay time is set such that an end time of the analog-to-digital conversion period is earlier than a completion time of the sensing data transmission.

14. The touch sensing device of claim 12, wherein the communication processor is configured to transmit the sensing data to the touch controller in response to a signal received by transmitting an interrupt request to the touch controller, and to control the transmission of the first digital sensing value to be started before the analog-to-digital conversion period is completed by controlling a transmission timing of the interrupt request according to the delay time.

15. The touch sensing device of claim 10, wherein a front portion of a sensing data transmission period in which the sensing data is transmitted to the touch controller entirely or partially overlaps the analog-digital conversion period, and a rear portion of the sensing data transmission period does not overlap or partially overlaps another touch sensing period that is performed after the analog-to-digital conversion period.

16. The touch sensing device of claim 1, wherein the converting of at least one of first and second touch sensing signals into the first and second digital sensing values and the transmitting of at least part of the sensing data to the touch controller are performed in parallel.

* * * * *